(12) United States Patent
Wang

(10) Patent No.: US 7,053,490 B1
(45) Date of Patent: May 30, 2006

(54) PLANAR BOND PAD DESIGN AND METHOD OF MAKING THE SAME

(75) Inventor: Tsing Chow Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/191,463

(22) Filed: Jul. 27, 2005

(51) Int. Cl.
- H01L 23/48 (2006.01)
- H01L 23/52 (2006.01)
- H01L 29/40 (2006.01)

(52) U.S. Cl. ..................... 257/780; 257/781
(58) Field of Classification Search ............... 257/780, 257/781, 737, 738
See application file for complete search history.

(56) References Cited

U.S. PATENT DOCUMENTS

| | | | |
|---|---|---|---|
| 5,587,336 A | 12/1996 | Wang et al. | |
| 6,316,813 B1 | 11/2001 | Ohmi et al. | |
| 6,362,090 B1 * | 3/2002 | Paik et al. | 438/614 |
| 6,448,171 B1 | 9/2002 | Wang et al. | |
| 6,501,185 B1 * | 12/2002 | Chow et al. | 257/780 |
| 6,597,069 B1 * | 7/2003 | Degani et al. | 257/778 |
| 6,759,751 B1 * | 7/2004 | Sinha | 257/779 |
| 6,853,076 B1 * | 2/2005 | Datta et al. | 257/738 |
| 6,958,546 B1 * | 10/2005 | Fan et al. | 257/773 |
| 2004/0159944 A1 * | 8/2004 | Datta et al. | 257/737 |

* cited by examiner

*Primary Examiner*—S. V. Clark
(74) *Attorney, Agent, or Firm*—Townsend, Townsend and Crew LLP

(57) ABSTRACT

Techniques for an integrated circuit device with planar bond pads are provided. A metal layer region is formed on a substrate. The integrated circuit device also includes a passivation layer that has an opening formed around the metal layer region. The passivation layer and a top surface of the metal layer region defines a continuous planar surface. An under bump metallurgy structure, sized and positioned to completely overlay the top surface of the metal layer region, is coupled to the continuous planar surface. The under bump metallurgy structure is coupled to a bump termination electrode. Preferably, a top surface of the bump termination electrode has a maximum surface nonuniformity of less than about 1 micron.

14 Claims, 4 Drawing Sheets

PLANAR BOND PAD DESIGN AND METHOD OF MAKING THE SAME

BACKGROUND OF THE INVENTION

The present invention is directed to integrated circuits and their processing for the manufacture of semiconductor devices. More particularly, the invention provides methods and structures for manufacturing planar bond pad structures for advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry," has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of bonding pad structures of integrated circuit devices. Such bonding pad structures have traditionally became smaller and smaller and occupy a smaller region of silicon real estate. Although there have been significant improvements, designs for bond pad structures still have many limitations. As merely an example, these designs must become smaller but still provide sufficient mechanical properties to support a bonded wire structure. Conventional bonding pad designs often have quality and reliability problems in fine pitch designs due to non-planar bonding surfaces. As illustrated in FIG. 1, a conventional bond pad structure 100 includes a passivation layer 102 that is elevated over a portion of metal layer 104. An elevated portion of passivation layer 102 is needed to seal the underlying metal layer region 104. Unfortunately, the elevation in passivation layer 102 results in a nonuniform surface 106, or crown, for bump termination electrode 108. In another conventional bonding pad structure 200, crown formation on surface 206 is precluded by avoiding areas directly overlying the periphery of metal layer region 204 (or corresponding to the elevated portions of passivation layer 202). However, this structure impairs bondability by reducing the total surface area available for bonding. Additionally, conventional bonding pad designs often require complex manufacturing processes, such two masks processes or elevated passivation layers. These and other limitations will be described in further detail throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides methods and structures for manufacturing planar bond pads for advanced integrated circuit devices. But it would be recognized that the invention has a much broader range of applicability.

In a specific embodiment, the invention provides an integrated circuit device. The integrated circuit device includes a substrate. A metal layer region is formed on the substrate. The integrated circuit device also includes a passivation layer that has an opening formed around the metal layer region. The passivation layer and a top surface of the metal layer region defines a continuous planar surface with a maximum surface nonuniformity of less than about 1 micron. An under bump metallurgy structure, sized and positioned to completely overlay the top surface of the metal layer region, is coupled to the continuous planar surface. The under bump metallurgy structure is coupled to a bump termination electrode, which has a top surface with a maximum surface nonuniformity of less than about 1 micron.

In yet another embodiment, the present invention provides a method for manufacturing a bond pad structure for semiconductor devices. A surface defined by a metal layer region and a passivation region is provided. The surface is polished to produce a planar surface with a maximum surface nonuniformity of less than about 0.2 microns. A PVD first thin film is deposited over the planar surface. The method also includes depositing a PVD second thin film layer over the PVD first thin film. Next, a photoresist layer is deposited over the metal layer. A first mask is used to pattern a trench in the photoresist layer aligned directly over the metal layer region. A bump termination electrode is plated in the trench. After which, the photoresist layer is etched. The PVD second and first thin film layers are etched using the bump termination electrode as a self-aligned mask. A top surface of the bump termination electrode has a maximum surface nonuniformity of less than about 1 micron.

Many benefits are achieved by way of the present invention over conventional techniques. For example, the present technique provides an easy to use process that relies upon conventional technology. In some embodiments, the method provides planar bond topology. Additionally, methods provide processes that are compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. More particularly, the invention provides methods and structures for manufacturing planar bond pads for advanced integrated circuit devices. But it would be recognized that the invention has a much broader range of applicability.

Figure 1:
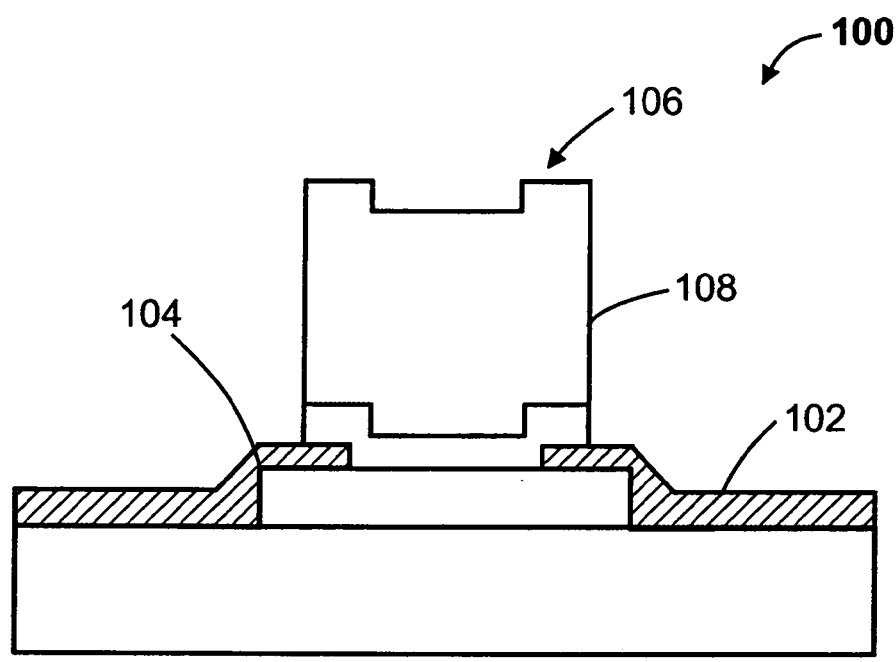
FIG. 1 is a simplified diagram illustrating a cross-sectional view of a conventional bonding pad structure.
Figure 2:
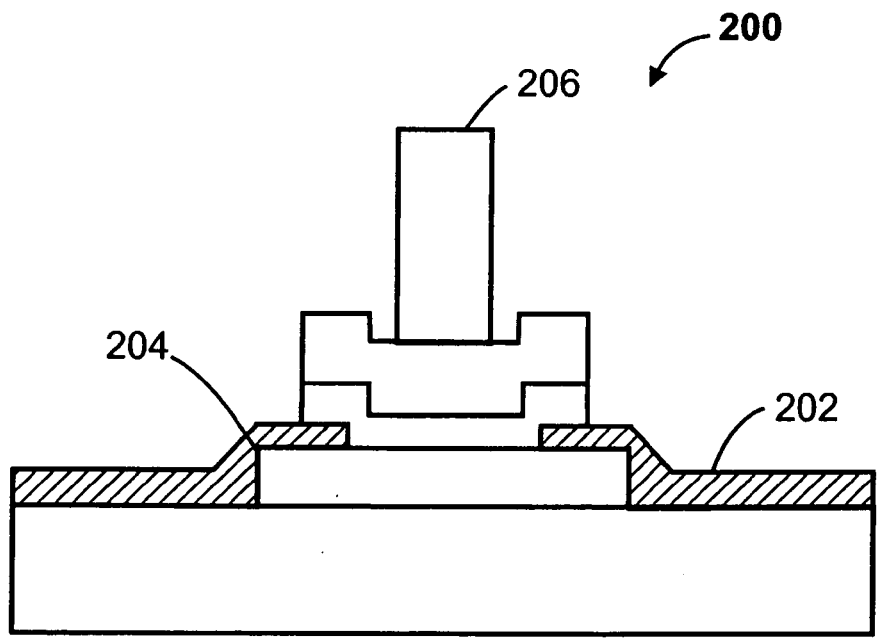
FIG. 2 is a simplified diagram illustrating a cross-sectional view of another conventional bonding pad structure.
Figure 3:
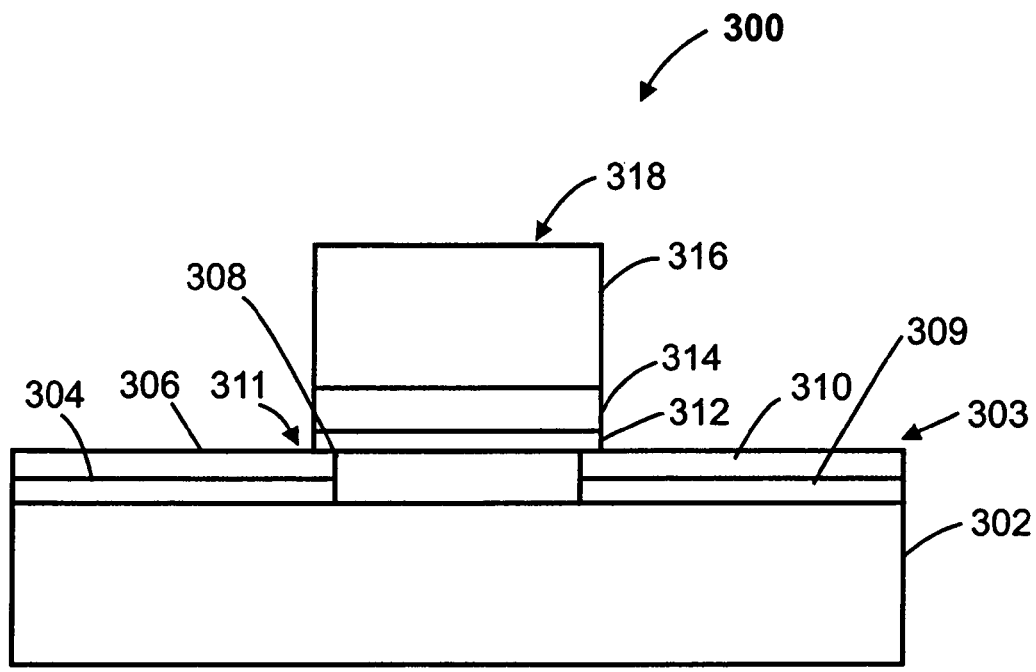
FIG. 3 is a simplified diagram illustrating a cross-sectional view of a bonding pad structure according to an embodiment of the present invention.

FIG. 3 is a simplified diagram illustrating a cross-sectional view of a bonding pad structure 300 according to an embodiment of the present invention. This diagram is merely an example, which should not unduly limit the scope of the claims herein. One of ordinary skill in the art would recognize many variations, alternatives, and modifications. As shown, bonding pad structure 300 includes a substrate 302. Preferably, substrate 302 is a silicon wafer or silicon on insulator wafer or the like. Substrate 302 typically includes thereon or therein electronic devices (such as MOS devices, resistors, transistors, diodes, capacitors, and the like).

In this specific embodiment, a passivation layer 303 overlies substrate 302. In alternate embodiments, one or more intermediary layers may be disposed between passivation layer 303 and substrate 302. Passivation layer 303 assures chemical stability of surface 309. That is to say, surface 309 is rendered chemically passive and oxidation is prevented. Passivation layer 303 itself can include one or more layers. For example, a first layer 304 of passivation layer 303 can comprise silicon oxide (SiO), and a second layer 306 can comprise silicon nitride (SiN) or silicon oxynitride (SiOxNy). Passivation layer 303 has an opening formed around a metal layer region 308. Metal layer region 308 can generally include aluminum (Al) or copper (Cu), as well as other metals. The passivation layer and a top surface of the metal layer region 308 define a continuous planar surface 310, or surface 310 is substantially smooth. Preferably, continuous planar surface 310 has a maximum surface nonuniformity of less than about 0.4 microns, or more preferably less than about 0.2 microns.

An under bump metallurgy (UBM) structure 311 is disposed over surface 310. In this exemplary embodiment, UBM structure 311 can be a multilayered structure. For example, UBM first layer 312 can be a physical vapor deposition thin film 312 of titanium tungsten (TiW) or chromium and the like. While, UBM second layer 314 can be a PVD second thin film layer 314 of gold (Au) or copper (Cu) and the like.

The UBM structure 311, coupled to continuous planar surface 310, is positioned to completely overlay the top surface of the metal layer region 308. By extending UBM structure 311 in such a manner, UBM structure 311 provides a hermetic seal over metal layer region 308. UBM structure 311 is also coupled to a bump termination electrode 316. Top surface 318 of bump termination electrode 316 does not bear a crown. In fact, top surface 318 can have maximum surface nonuniformity of less than about 1 micron, or preferably less than about 0.8 microns. Thus, top surface 318 provides a level surface for improved bondability in fine pitch designs and improved structural integrity of interconnects.

Bump termination electrode 316 and UBM structure 311 can be about equal widths and lengths. However, in alternative embodiments, this need not be the case. Dimensions of bump termination electrode 316 and UBM structure 311 may vary for a specific application. For example, an advanced integrated circuit may have bump termination electrodes and UBM structures ranging from about 30 microns to 20 microns, or even less. The height of bonding pad structure 300 from continuous planar surface 310 will depend on the thickness of both bump termination electrode 316 and UBM structure 311. Typically, without limitation, the height of bonding pad structure 300 ranges from about 10 microns to 20 microns. It should be noted that top surface 318 of bump termination electrode 316 preferably has a rectangular shape, although it can have any arbitrary shape (e.g., oval, square, circular, polygon, or the like).

Figure 4:
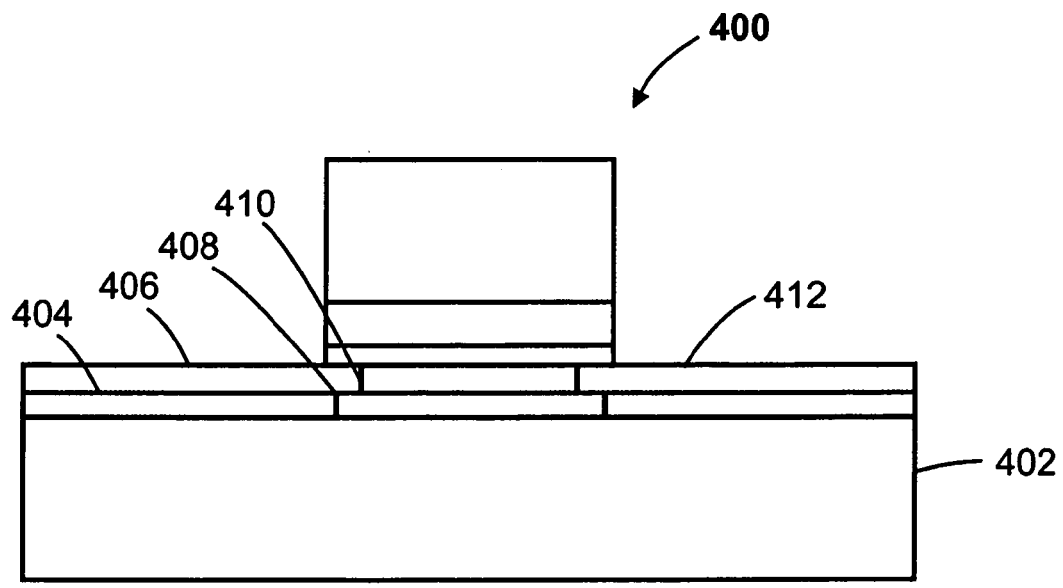
FIG. 4 is a simplified diagram illustrating a cross-sectional view of a bonding pad structure according to an embodiment of the present invention.

FIG. 4 is a simplified diagram illustrating a cross-sectional view of a bonding pad structure 400 according to an embodiment of the present invention. This diagram is merely an example, which should not unduly limit the scope of the claims herein. One of ordinary skill in the art would recognize many variations, alternatives, and modifications.

As shown, bonding pad structure 400 includes a passivation layer comprising a first layer 404 and a second layer 406. As discussed above, these layers can comprise silicon oxide materials, silicon nitride materials, silicon oxynitride materials, and combinations thereof. In this specific embodiment, two metal layer regions 408, 410 are coupled within the passivation layer. Metal layer regions 408 and 410 can be of the same material, although not necessarily. First layer 404 has an opening formed around a metal layer region 408, and second layer 406 has an opening formed around a metal layer region 410. A continuous planar surface 412 is defined by second layer 406 and metal layer region 410. Surface 412 has a maximum surface nonuniformity of less than about 0.4 microns, preferably less than about 0.2 microns. A UBM structure and bump termination electrode are disposed directly above metal layer regions 408, 410.

Figure 5:
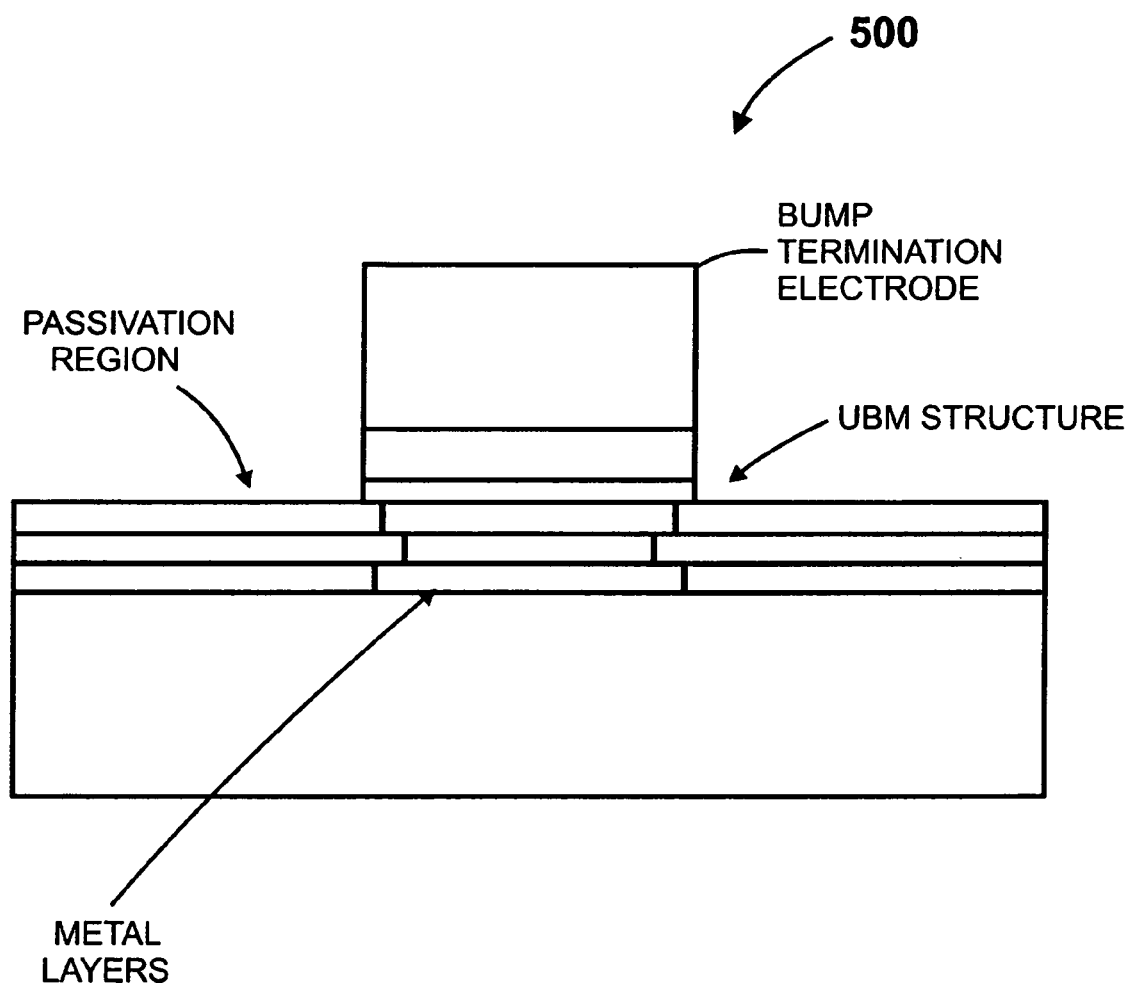
FIG. 5 is a simplified diagram illustrating a cross-sectional view of a bonding pad structure according to an embodiment of the present invention.

FIG. 5 is a simplified diagram illustrating a cross-sectional view of a bonding pad structure 500 according to an embodiment of the present invention. This diagram is merely an example, which should not unduly limit the scope of the claims herein. One of ordinary skill in the art would recognize many variations, alternatives, and modifications. Bonding pad structure 500 includes three metal layer regions coupled over a substrate and within a passivation region. The passivation region includes three layers. In this specific embodiment, a top surface of the passivation region and top surface of a metal layer region together define a planar surface. Moreover, layers within bonding pad structure 500, such as the layers of the passivation region, UBM structure, and bump termination electrode, can each be planar, or preferably have a maximum surface nonuniformity of less than about 0.8 micron.

Figure 6:
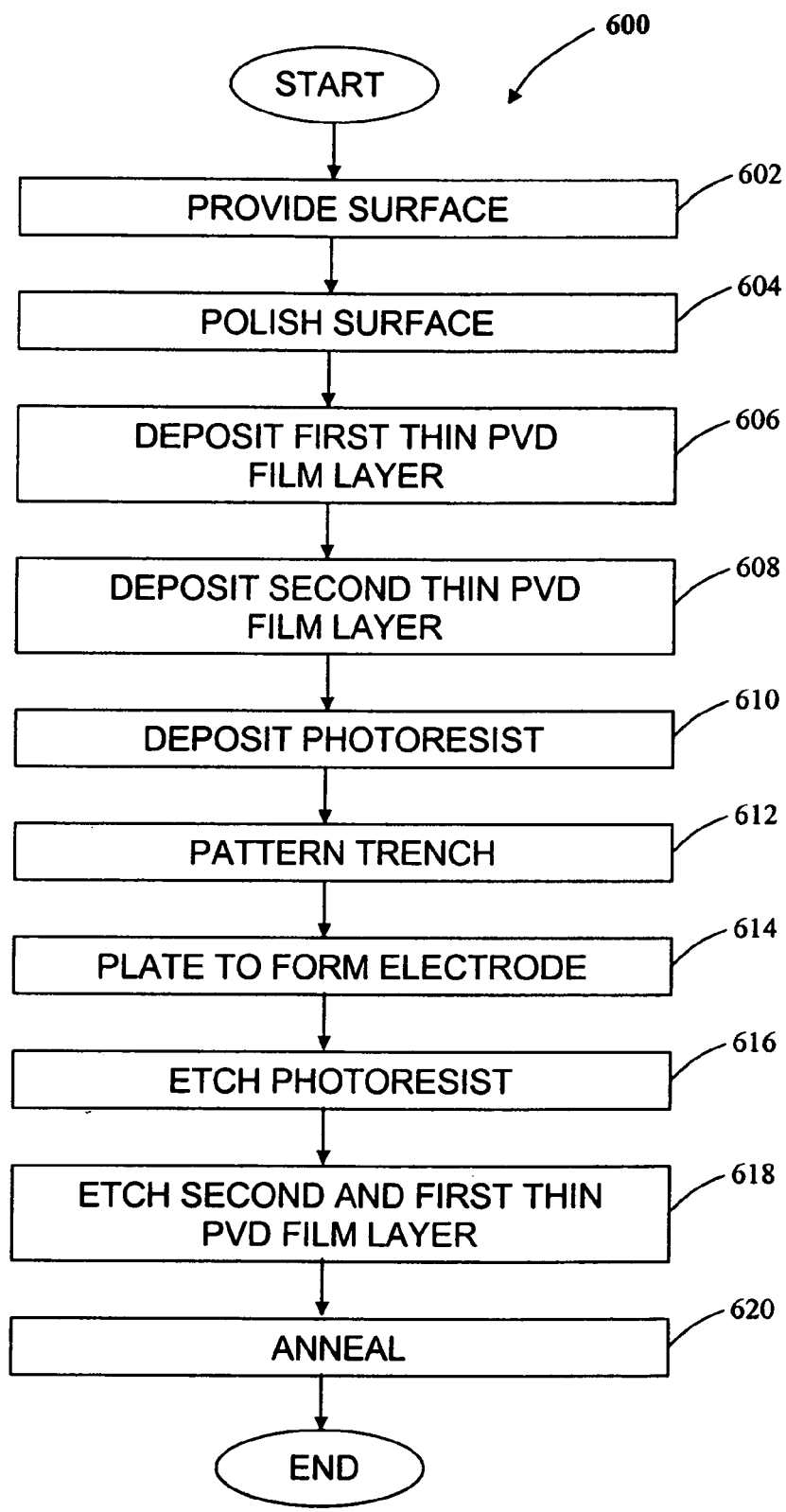
FIG. 6 illustrates a method for manufacturing a bonding pad structure according to an embodiment of the present invention.

FIG. 6 is a simplified method for manufacturing a bonding pad structure according to an embodiment of the present invention. The method 600 includes the following processes:

1. Process 602 for providing surface that includes a passivation layer surrounding a metal layer region.

2. Process 604 for polishing the surface to make it substantially planar. In one embodiment, a chemical-mechanical polishing process can be used.
3. Process 606 for depositing a PVD first thin film. The thin film is the bottom layer for a UBM structure.
4. Process 608 for depositing a PVD second thin film layer for the UBM structure.
5. Process 610 for depositing a photoresist over the UBM structure.
6. Process 612 for patterning a trench in the photoresist directly above the metal layer region(s) using a photolithographic process.
7. Process 614 for plating a bump termination electrode in the trench.
8. Process 616 for etching away the photoresist (and any other photolithographic films, such as any anti-reflective layer). The etchant can be a conventional photoresist stripper.
7. Process 618 for etching the UBM structure (i.e., PVD second and first thin film layers) using the bump termination electrode as a mask. The etchant can be potassium iodine (KI) to etch gold (Au), and hydro peroxide ($H_2O_2$) to etch titanium tungsten (TiW).
8. Process 620 for annealing the bond pad structure.

The above sequence of processes provides a method according to an embodiment of the present invention. In this embodiment, only one mask is needed to form the bonding pad structure. Other alternatives can also be provided where processes are added, one or more processes are removed, or one or more processes are provided in a different sequence without departing from the scope of the claims herein. For example, additional processes are provided to form an additional metal layer region within a passivation layer. Future details of the present invention can be found throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device comprising:
   a substrate;
   a metal layer region formed on the substrate;
   a passivation layer having an opening formed around the metal layer region;
   a continuous planar surface defined by the passivation layer and a top surface of the metal layer region, the continuous planar surface having a maximum surface nonuniformity of less than about 0.2 microns;
   an under bump metallurgy structure coupled to the continuous planar surface, the under bump metallurgy structure sized and positioned to at least completely overlay the top surface of the metal layer region; and
   a bump termination electrode coupled to the under bump metallurgy structure,
   wherein a top surface of the bump termination electrode has a maximum surface nonuniformity of less than about 1 micron.

2. The integrated circuit device of claim 1 wherein the bump termination electrode comprises gold.

3. The integrated circuit device of claim 2 wherein the bump termination electrode is plated to the under bump metallurgy.

4. The integrated circuit device of claim 1 wherein the passivation layer comprises a first layer and a second layer, the first layer including silicon oxide, and the second layer including at least one of silicon nitride and silicon oxynitride.

5. The integrated circuit device of claim 1 wherein the metal layer region comprises aluminum.

6. The integrated circuit device of claim 1 wherein the metal layer region comprises copper.

7. The integrated circuit device of claim 1 wherein the under bump metallurgy structure comprises both a physical vapor deposition first thin film adhesion/barrier layer and a second thin film wetting layer.

8. The integrated circuit device of claim 7 wherein the second thin film wetting layer comprises gold.

9. The integrated circuit device of claim 1 wherein a length of the metal layer region is less than 30 microns.

10. The integrated circuit device of claim 1 wherein the top surface of the bump termination electrode is shaped at least one of a rectangle, square, oval, circle, and polygon.

11. The integrated circuit device of claim 1 wherein the top surface of the bump termination electrode has a maximum surface nonuniformity of less than about 0.8 microns.

12. An integrated circuit device comprising:
   a substrate;
   a metal layer region formed on the substrate;
   a silicon oxide material layer having an opening formed around the metal layer region;
   a silicon oxynitride material layer having an opening formed around the metal layer region and overlying the silicon oxide layer;
   a continuous planar surface defined by the silicon oxynitride material layer and a top surface of the metal layer region, the continuous planar surface having a maximum surface nonuniformity of less than about 0.2 microns;
   a physical vapor deposition first thin film layer coupled to the continuous planar surface, the physical vapor deposition first thin film layer sized and positioned to at least completely overlay the top surface of the metal layer region;
   a physical vapor deposition second thin film layer overlying the physical vapor deposition first thin film layer, the physical vapor deposition second and first thin film layers sized and positioned to at least completely overlay the top surface of the metal layer region; and
   a gold bump termination electrode coupled to the physical vapor deposition second thin film layer, the gold bump termination electrode sized and positioned to at least completely overlay the top surface of the metal layer region,
   wherein a top surface of the gold bump termination electrode has a maximum surface nonuniformity of less than about 1 micron.

13. An integrated circuit device comprising:
   a substrate;
   a plurality of metal layer regions formed on the substrate;
   a passivation layer having an opening formed around each of the plurality of metal layer regions;
   a continuous planar surface defined by the passivation layer and top surfaces of the plurality of the metal layer regions, the continuous planar surface having a maximum surface nonuniformity of less than about 0.2 microns;
   a plurality of under bump metallurgy structures each coupled to the continuous planar surface, each of the plurality of under bump metallurgy structures sized and positioned to at least completely overlay a top surface of the plurality of metal layer regions; and a plurality of bump termination electrodes each coupled to one of the plurality of under bump metallurgy structures, wherein top surfaces of the plurality of bump termination electrodes each has a maximum surface nonuniformity of less than about 1 micron.

14. The integrated circuit device of claim 13 wherein a first bump termination electrode of the plurality of bump termination electrodes is disposed about 25 microns to about 10 microns from a second bump termination electrode of the plurality of bump termination electrodes.

* * * * *